United States Patent [19]
Edwards et al.

[11] Patent Number: 4,937,697
[45] Date of Patent: Jun. 26, 1990

[54] SEMICONDUCTOR DEVICE PROTECTION CIRCUIT

[75] Inventors: Arthur J. Edwards, Hoffman Estates; Kirk Sievers, Roselle, both of Ill.

[73] Assignee: Motorola, Inc., Schaumburg, Ill.

[21] Appl. No.: 355,228

[22] Filed: May 22, 1989

[51] Int. Cl.⁵ .......................... H02H 9/02; H02H 7/10
[52] U.S. Cl. .................................. 361/18; 361/79; 361/86; 361/103; 323/276; 323/281; 323/285; 323/901
[58] Field of Search .............. 361/18, 42, 79, 86, 361/89, 91, 103; 323/281, 276, 275, 279, 285, 284, 313, 315–317, 907

[56] References Cited
U.S. PATENT DOCUMENTS

| | | | |
|---|---|---|---|
| 4,021,701 | 5/1977 | Davies | 361/18 |
| 4,330,809 | 5/1982 | Stanley | 361/103 |
| 4,380,728 | 4/1983 | Kearney | 323/281 |
| 4,633,165 | 12/1986 | Pietkiewicz et al. | 323/316 X |
| 4,680,667 | 7/1987 | Petrie | 361/154 |
| 4,703,390 | 10/1987 | Fay et al. | 361/18 X |
| 4,736,267 | 4/1988 | Karlmann et al. | 361/101 |
| 4,771,357 | 9/1988 | Lorinez et al. | 361/87 |
| 4,787,007 | 11/1988 | Matsumura et al. | 361/91 X |
| 4,896,245 | 1/1990 | Qualich | 361/103 |

Primary Examiner—Todd E. Deboer
Attorney, Agent, or Firm—Phillip H. Melamed

[57] ABSTRACT

Semiconductor device protection circuit (10) provides increased power dissipation (current) limits for FET (11) when lower FET temperatures exist. The FET drain to source voltage ($V_{DS}$) is monitored to provide a current sense signal (54). When the current sense signal exceeds a predetermined reference limit signal ($V_{REF,55}$), a control circuit (23, 32) reduces current (power dissipation) in the FET. Circuitry (24) provides the reference limit signal ($V_{REF}$) with a predetermined temperature variation as a function of the sensed temperature of the FET whereby for low device temperatures higher power dissipation (current) limits for the FET are provided. An additional control circuit (21, 30) provides short circuit overcurrent protection by reducing current in the FET when sensed FET current exceeds a predetermined limit. A delay circuit (39) inhibits operation of at least the control circuit (20, 32) until a predetermined time ($t_1$) after the FET is turned on.

14 Claims, 2 Drawing Sheets

SEMICONDUCTOR DEVICE PROTECTION CIRCUIT

BACKGROUND OF THE INVENTION

The invention relates to the field of semiconductor device protection circuits, and more particularly to the field of such protection circuits which prevent damage to the semiconductor device by limiting the maximum amount of power dissipatioon and/or current permitted in the semiconductor device.

In prior protection circuits, a signal is developed related to the amount of power dissipation or current occurring in a semiconductor device. This signal is then compared to a fixed limit signal, and the device is turned off, or excitation to the device is reduced, so as to reduce power dissipation or current in the device when the limit has been exceeded. While such circuits do prevent excessive power dissipation in the semiconductor device, sometimes, such as for low device temperatures, the semiconductor device could actually dissipate additional power without any damage to the damage. However, since the protection device must guard against a worst case situation, a conservative fixed power dissipation/current limit is implemented for the semiconductor device. Thus many times the normal operation of the semiconductor device at low temperatures may be unnecessarily interrupted by reducing the power dissipation/current of the device even though this reduction is not necessary to protect the device.

Some prior protection circuits have developed a signal indicative of the temperature of a semiconductor device. These circuits then reduce power dissipation of (current through) the semiconductor device just in response to the sensed temperature of the device exceeding some maximum predetermined fixed temperature limit value. The sensed temperature signal produced in these prior circuits is provided by a temperature sensing element separate from the semiconductor device and therefore may not accurately be representative of the semiconductor device actual temperature. Thus, a substantial safety margin must be designed into such protection circuits to ensure that excessive power dissipation of the semiconductor device does not occur because of variable poor thermal coupling between the semiconductor device and the additional temperature sensing element. Also, such protection circuits really do not provide a power dissipation limit, but actually just provide a maximum temperature limit since they just monitor device temperature and not power dissipation. In addition, such circuits typically require extensive additional circuitry to provide any additional short circuit overcurrent limitation for the device.

Some prior protection circuits develop a signal related to the current passed through a semiconductor device. This signal is developed either by monitoring the voltage across an added current sense resistor connected in series with the device or by monitoring the voltage across the device. In either case, the current sense signal is just compared to a fixed reference threshold. Thus, as noted above, these circuits may unnecessarily interrupt normal operation of the device at low temperatures. Also, if these prior circuits reduce radio frequency interference by slowing down the rate of device switching, this will result in slowing down the circuit response to detected overcurrent conditions, and this isn't desirable.

SUMMARY OF THE INVENTION

An object of the present invention is to provide an improved semiconductor device protection circuit which overcomes at least some of the above noted problems associated with prior protection circuits.

In one embodiment of the present invention a semiconductor device protection circuit is provided. This protection circuit comprises a semiconductor device which receives at least one control signal and, in response thereto, selectively passes current through it. Sense circuitry is coupled to the device for providing a power dissipation (current) sense signal having a magnitude indicative of the power being dissipated by (current passed through) the device when the device is on. A first control means receives this power dissipation (current) sense signal and also a first predetermined reference limit signal and modifies the control signal received by the semiconductor device so as to reduce power dissipation in the device in response to the sense signal exceeding the magnitude of the reference limit signal by a predetermined amount. Circuitry is provided for developing the predetermined reference limit signal such that this signal varies in accordance with a sensed temperature signal and has a magnitude varying in accordance with the temperature of the device. According to the preceding structure, for low device temperatures, higher power dissipation (maximum current) limits are thereby provided for the device before the control circuitry modifies operation of the device.

Preferably the reference limit signal will vary inversely by at least 0.10 percent (0.10%) per degree centigrade of the sensed temperature of the device. Also, the magnitude of the power dissipation (current) sense signal will also vary as a function of the temperature of the device. Also, preferably, the device comprises a FET (field effect transistor) transistor and the power dissipation (current) sense signal corresponds to the drain to source FET voltage. In addition, an additional control circuit is provided for reducing current through the device in response to the magnitude of a current sense signal exceeding the magnitude of a second predetermined reference limit signal such that excessive current in the device is prevented regardless of the power dissipation of the device. Preferably, this current sense signal is identical to the power dissipation sense signal, and the second reference signal magnitude is greater than the temperature varying first reference signal magnitude.

Essentially, the present invention allows a higher maximum power dissipation (current) limit for the device at low device temperatures while a smaller maximum power dissipation (current) limit is provide at higher temperatures. This result is accomplished by varying the first predetermined reference limit signal magnitude as a function of sensed device temperature. This permits normal operation of the device at lower device temperatures, whereas previous protection circuits would have altered device operation so as to prevent excessive power dissipation (current) even though such protection may not have been necessary. Thus the present invention provides improved protection circuitry since interruption of the semiconductor device operation is only accomplished when such interruption is necessary. The above noted features of the present invention, as well as additional significant features and advantages are discussed subsequently in more detail.

BRIEF DESCRIPTION OF THE DRAWINGS

For a more complete understanding of the invention reference should be made to the drawings, in which.

DESCRIPTION OF THE PREFERRED EMBODIMENTS

Figure 1:
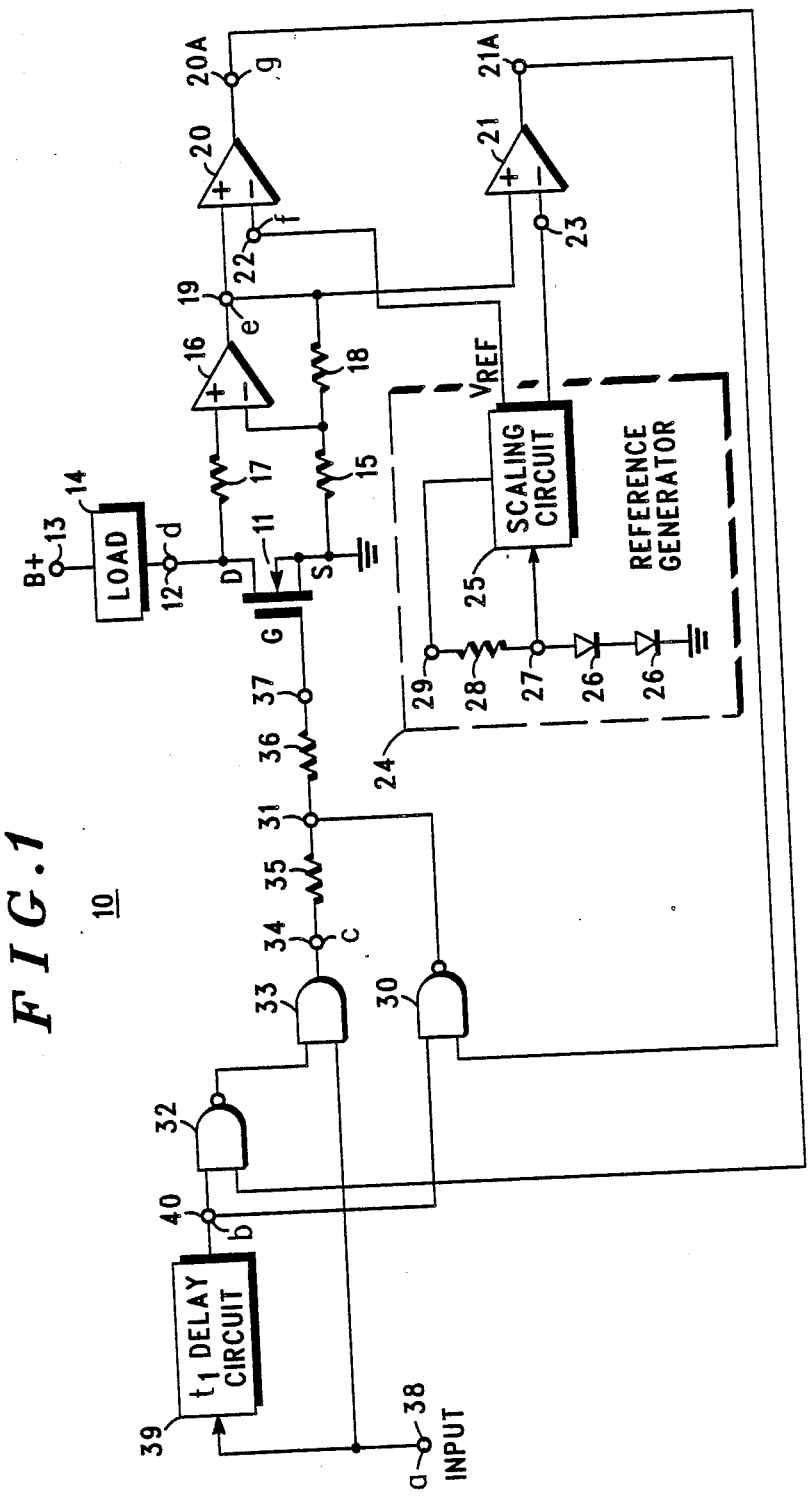
FIG. 1 is a schematic diagram of a semiconductor device protection circuit constructed in accordance with the present invention.

FIG. 1 illustrates a semiconductor device protection circuit 10 in which a semiconductor device, comprising a FET transistor 11, having gate (G), drain (D) and sources electrodes, is protected against excessive power dissipation (current) and short circuit overcurrent. The drain electrode D is connected to a terminal 12 which is connected to a B+ battery supplied potential at a terminal 13 through a load 14. The source terminal S is connected to ground and connected through a resistor 15 the negative input terminal of an operational amplifier 16 which has its positive input terminal connected through a resistor 17 to the drain electrode. A gain control resistor 18 is connected between the negative input terminal of the amplifier 16 and an output terminal 19 of the amplifier which is connected as an input to the positive input terminals of a power dissipation current limit compatator 20 and a short circuit current limit comparator 21.

A temperature varying reference signal $V_{REF}$ is provided at a reference terminal 22 which is connected to the negative input terminal of the comparator 20. A short circuit reference signal, which may also be temperature varying, is provided at a reference terminal 23 which is directly connected to the negative input of the comparator 21. A reference generator 24 (shown dashed FIG. 1) provides the reference signals at the terminals 22 and 23 by virtue of a scaling circuit 25. An input to the scaling circuit 25 is provided at a terminal 27 by the series connection of two semiconductor diodes 26 connected between the terminal 27 and ground potential and a resistor 28 connected between the terminal 27 and a terminal 29 at which a source of fixed positive DC reference potential is provided.

The output of the comparator 21 is provided at a terminal 21A. This is provided as one input to a NAND gate 30 whose output is provided at a terminal 31. The output of the comparator 20 is provided at a terminal 20A. This is provided as one input to a NAND gate 32 whose output is provided as one input to AND gate 33 providing an output at a terminal 34. The terminal 34 is coupled through a resistor 35 to the terminal 31 which is in turn is coupled through a resistor 36 to an input terminal 37 corresponding to the gate electrode G of the FET 11.

A terminal 38 of the protection circuit 10 receives an on/of input signal thereat and is connected as one input to the AND gate 33. The terminal 38 is also coupled through a $t_1$ delay circuit 39 to an output terminal 40 which is connected as an input to the NAND gates 30 and 32.

Figure 4:
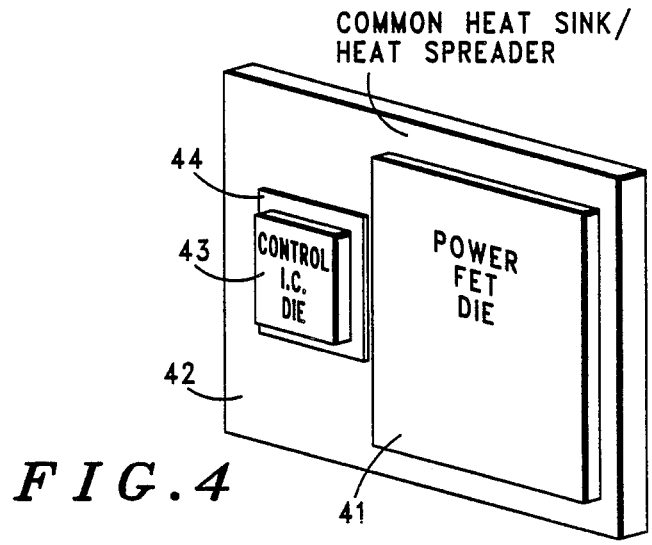
FIG. 4 is a pictorial view of the preferred mounting of a semiconductor device and control circuit which comprise the circuit shown in FIG. 1.

The protection circuit 10 described above and shown in FIG. 1 is preferably implemented by die bonding (mounting) a semiconductor die 41, corresponding to the FET transistor 11, on a heat sink or heat spreader 42 as shown in FIG. 4. The remaining components shown in FIG. 1, with the exception of the load 14, are provided on integrated circuit die 43 which is also die bonded to the heat sink 42 and is positioned adjacent the semiconductor FET die 41. Preferably, the die 43 may be electrically isolated from the heat sink 42 by an electrically insulating, but thermally conductive, material 44 positioned therebetween. Due to the mechanical mounting configuration indicated in FIG. 4, essentially the temperature of the semiconductor die 43 will substantially track the temperature of the power FET die 41. Thus the temperature of the diodes 26 on the integrated circuit die 43 will correspond to the FET die temperature. Thus the voltage developed across the diodes 26 will vary in accordance with the sensed temperature of the die 41. Since the voltage across one diode varies by approximately 2 millivots for each degree centigrade, the voltage at terminal 27 has twice this variation.

Figure 3:
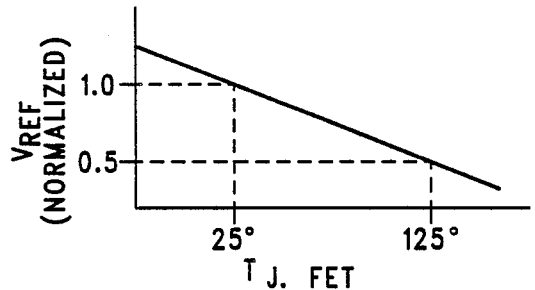
FIG. 3 is a graph showing the desired temperature variation of a reference limit signal $V_{REF}$ provided by the circuit in FIG. 1.

The scaling circuit 25 receives the temperature variable signal produced at the terminal 27. The circuit 25 essentially offsets this signal by a desired DC level while multiplying this signal to provide a desired temperature variation for the temperature varying reference signal $V_{REF}$ produced at the terminal 22. FIG. 3 illustrates a graph showing a typical desired temperature variation for this signal. FIG. 3 illustrates that at a nominal temperature of 25 degrees centigrade for the FET die, referred to as $T_{J,FET}$ in FIG. 3, a normalized reference voltage $V_{REF}$ of 1.0 is provided. For 125 degrees centigrade of the FET die temperature only fifty percent (50%) of this value is achieved. These numbers indicate therefore a 0.50 percent (0.50%) change (reduction) in the temperature varying reference signal $V_{REF}$ per degree centigrade change of the FET junction temperature. It is suggested that any such temperature variation of the signal $V_{REF}$ which is at least 0.10% per degree centigrade of FET temperature could be utilized. The terms "temperature varying", "temperature variable", and "varying as a function of temperature" are defined herein as indicating at least such a variation. This temperature variation distinguishes the present invention from prior circuits in which a fixed reference voltage at the terminal 22 is produced. Such a fixed reference voltage would therefore be indicative of a reference voltage that did not vary as a function of FET temperature.

With a fixed voltage at the terminal 22, the comparator 20 would implement a fixed maximum current limit for the FET 11 and this current limit would not be effectively adjusted to a higher value even at lower FET temperatures. This would not be desirable since larger FET current, which causes FET power dissipation, can be tolerated at lower temperatures since for such lower temperatures more power dissipation can be permitted in the FET 11. The present invention achieves this desirable result by providing a temperature variable limit signal $V_{REF}$ at the terminal 22 whereas the prior art used a fixed referenced voltage.

The overall operation of the circuit in FIG. 1 will now be discussed with reference to the components illustrated in FIG. 1 and the signal waveforms shown in FIG. 2 as graphs a–g. The graphs a–g represent the signal waveforms provided at the terminals 38, 40, 34, 12, 19, 22 and 20A, respectively. In FIG. 1 corresponding alphabetic designations are shown for these terminals to facilitate understanding the following explanation.

At a time $t_0$, a signal 50 at the terminal 38 under goes a low (off) to high (on) transition. The signal 50 is indicative of the desired on/off state for the FET 11. In response to this transition at the time $t_0$ the delay circuit 39 produces at the terminal 40 a signal 51 in response thereto. The signal 51 directly corresponds to the signal 50 except that the low to high transition now occurs at a delay time $t_1$. The maintaining of a low logic signal for the signal 51 between the times $t_0$ and $t_1$ insures that the AND gate 33 will provide a high logic state at the terminals 34 and 31 during this initial time delay regardless of the outputs of the comparators 20 and 21. This prevents the comparators 20 and 21 from controlling the FET 11 during the time $t_0$ to $t_1$.

Figure 2:
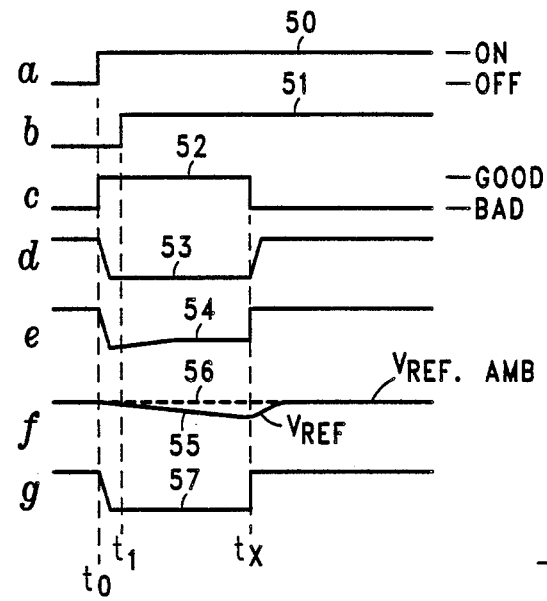
FIG. 2 comprises a series of graphs a-g representative of the waveforms of various signals provided by the circuit shown in FIG. 1.

The signal at the terminal 34 is designated as signal 52 in FIG. 2. The signal 52 is coupled to the gate terminal 37 through the resistors 35 and 36 and results in the initial turning on of the FET 11 at time $t_0$. A signal 53 shown in FIG. 2 is representative of the FET drain voltage which is provided by the resistor 17 to the operational amplifier 16. The drain voltage signal 53 indicates that during the time $t_0$ to $t_1$ the FET is being fully turned on by the signal 52. Initially, after the time $t_1$, the FET 11 is fully on. In FIG. 2, the variation of the signal 53 after the time $t_1$ is illustrated for the theoretical case of no self heating of the FET due to power dissipation effects. However, typically the signal 53 will gradually increase after the time $t_1$ due to self heating since drain voltage (on-resistance of the FET) is a function of FET temperature.

The amplifier 16 produces a signal 54 at the terminal 19 which is representative of the drain to source voltage of the FET. It should be noted that this drain to source voltage, when the FET is on, is a current sense signal since its magnitude is indicative of the current which passes through the transistor 11 when the device is on. This current sense signal is also indicative of the power being dissipated in the device 11 since the drain to source voltage, in combination with the on resistance of the FET, is a measure of the power dissipation of the FET 11.

As shown in FIG. 2, the signal 54, representative of the FET drain to source voltage $V_{DS}$, reaches a minimum during the time $t_0$ to $t_1$. After $t_1$, the signal 54 shown in FIG. 2 gradually increases due to the heating up of the on resistance of the FET due to the power being dissipated in the FET. The signal 54 provided at the terminal 19 is actually an amplified version of the drain to source voltage since it comprises the drain to source voltage multiplied by an amplication factor produced by the amplifier 16. This amplification factor is determined by the magnitude of the gain control resistor 18 which can be adjusted to provide any desired amplification. The amplifier 16 also provides any desired DC level shift for the signal 54.

The signal 54 at the terminal 19, which is representative of the FET drain to source voltage multiplied by the amplication factor of the amplifier 16, is compared to the temperature varying reference limit signal $V_{REF}$ provided at the terminal 22. This reference limit signal at the terminal 22 has a predetermined temperature variation as a function of the temperature of the FET die 41. This variation occurs due to the diodes 26 sensing the temperature of the heat sink 42 and providing a temperature varying signal at the terminal 27. This temperature varying signal is then suitably amplified and offset adjusted by the scaling circuit 25 to provide the signal $V_{REF}$ at the terminal 22. FIG. 3 illustrates a graph depicting a typical type of temperature variation to be provided for the signal $V_{REF}$. The signal $V_{REF}$ is also shown in FIG. 2 as signal 55. A dashed reference level 56 is indicated in FIG. 2 as representing the voltage $V_{REF}$ which would be produced if there were no heating up of the FET die 41 due to power dissipation effects. The reference level 56 is designated as $V_{REF-AMB}$ and is a function of the temperature of the ambient atmosphere surrounding the power FET die 41 assuming that the FET 11 provides no power dissipation self-heating.

In response to the comparison of the signals 54 and 55 by the comparator 20, the comparator provides as its resultant output a signal 57. After the delay time from $t_0$ to $t_1$, a low logic state will be initially provided by the comparator 20 as an input to the NAND gate 32. Thus the NAND gate 32, after the signal 51 at the terminal 40 goes high after the time $t_1$, will still allow the signal at the terminal 38 to directly determine the on/off state of the FET 11 assuming that no overcurrent-overpower dissipation fault has been detected.

While the device 11 is on, the drain to source voltage may become indicative of excessive current/power dissipation. This occurs when of the signal at the positive input terminal of the comparator 20 exceeds the temperature variable maximum reference voltage 55 ($V_{REF}$) provided at the terminal 22. In FIG. 2, this is shown to occur at a subsequent hypothetical time $t_X$. At this time, the signal 57 provided at the output terminal 20A of the comparator 20 will not be set to a high logic state. This will result in the signal 52 at the terminal 34 being set low which will turn off the FET 11 and therefore reduce the current in the FET and the power dissipation produced by the FET. The off state of the FET transistor 11 will be maintained until any additional subsequent transition from a low to a high state is provided at the terminal 38.

The preceding described operation of the present invention illustrates that the present embodiment has provided a temperature variable reference limit signal 55 at the terminal 22. This has resulted in allowing the FET transistor 11 to have a higher maximum current/power dissipation limit at lower temperatures before the control apparatus of the present invention will result in turning the FET off. Thus at lower temperatures, a higher power dissipation (current) rating is implemented for the FET 11 and this is not detrimental to operation of the FET. The primary advantage of such a configuration is that now the magnitude of the limit signal at the terminal 22 can be made closer to the actual maximum possible power dissipation (current) which can be allowed for the FET 11, since this limit will vary in temperature. In prior circuits, a fixed limit was provided at the terminal 22 thus necessitating turning off the FET 11 prematurely at lower FET temperatures. This premature interruption of the normal operation of the FET can be avoided with the present embodiment.

An additional feature of the present embodiment is the providing of a short circuit current overcurrent protection feature. This is implemented by the comparator 21. In response to the current sense signal 54 provided at the terminal 19 exceeding a short circuit current reference limit provided at the terminal 23, the output of the comparator 21 will be set high resulting in, when this occurs after the delay time $t_1$, the NAND gate 30 turning off the FET 11. In other words, for excessive short circuit current, the comparator 21 will turn off the FET 11 regardless of the power dissipation provided in the FET. This feature is significant in that if the load 14 is a short circuit, there is no reason for the FET 11 to continue to function. Thus if excessive current is sensed which is indicative of a short circuit of load 14, the present embodiment will shut off the FET 11 and thereby protect it from excessive current which might well damage wire bonds connecting the FET die 41 to other circuits. This damage might occur before there was any substantial increase in a FET die temperature which could be sensed by the diodes 26.

To insure a rapid turnoff of the FET 11 if excessive short circuit current exists, the output of the NAND gate 30 is connected to the gate terminal 37 through just the resistor 36 which has a substantially lower resistance than the resistor 35. The resistor 36 and the gate to source capacitance of the FET 11 essentially implement a fast turnoff for detected short circuit currents while a slower turnoff is implemented for the normal device turnoff provided in response to a high to low transition of the signal 50 at terminal 38. The capacitance between the gate and source electrodes of the FET, in combination of the resistors 35 and 36, slow down the turn on and turnoff transients provided in response to the input signal at the terminal 38 so as to minimize any radio frequency interference generated by switching the FET device on and off. Thus a short turnoff time is provided for overcurrent as compared to a longer turnoff time for normal switching of the FET 11.

It should be noted that the magnitude of the short circuit current reference signal at the terminal 23 should always exceed the magnitude of the temperature varying reference signal $V_{REF}$ at the terminal 22 throughout the normal operative temperature range for the FET 11. The short circuit reference signal at terminal 23 can also be made "temperature varying" by the scaling circuit 25 if greater accuracy is desired. However, since typically the short circuit current turn off level is relatively high, this may not be necessary. In addition, an advantage of the present embodiment is that the single current sense signal 54 provided at the terminal 19 is utilized to provide both the over current/power dissipation input to the comparator 20 and the short circuit current sense input signal to the comparator 21. This is all preferably accomplished without providing any current sense resistor connected in series with the FET to pass the same current that goes through the FET transistor 11. This is because the drain to source voltage of the FET is monitored so as to produce a signal indicative of the current passing through the FET without using a series current sense resistor. While some prior bipolar transistor protection circuits did monitor the collector to emitter voltage, the switching threshold for those circuits was not made temperature varying as is the case in the present embodiment.

Figure 5:
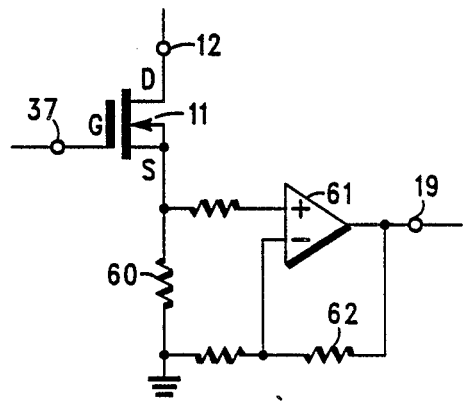
FIG. 5 is a schematic diagram of an alternate configuration for a portion of the circuit shown in FIG. 1.

Current sensing configurations other than sensing the FET drain to source voltage can be utilized. FIG. 5 illustrates one such alternate embodiment. In FIG. 5, a current sense resistor 60 is connected between the source electrode of FET 11 and ground potential. An operational amplifier 61 is connected across the current sensing resistor 60 and has a gain adjustment resistor 62 connected between its output and its negative input terminal. The output of the amplifier 61 is connected to the terminal 19 corresponding to the terminal 19 in FIG. 1. The remaining elements shown in FIG. 5 are designated with the same reference numbers as the corresponding elements shown in FIG. 1. Also, instead of the embodiment shown in FIG. 5, a FET transistor with current sensing electrodes can be utilized to provide an output signal related to the current passing through the FET. This signal could then be used to create the current sense signal at the terminal 19.

While I have shown and described specific embodiments of the present invention, further modifications and improvements will occur to those of skill in the art. All such modifications which retain the basic underlying principles disclosed and claimed herein are within the scope of this invention.

I claim:

1. A semiconductor device protection circuit comprising:
   semiconductor device for receiving at least one control signal and, in response thereto, selectively passing current therethrough;
   sense means coupled to said device for developing a power dissipation sense signal having a magnitude indicative of the power dissipated by said device when said device is on;
   first control means for receiving said power dissipation sense signal and a first predetermined reference limit signal and modifying said control signal to reduce power dissipation in said device in response to the magnitude of said sense signal exceeding the magnitude of said reference limit signal by a predetermined amount; and
   means for developing said predetermined reference limit signal such that said reference limit signal varies in accordance with a sensed temperature signal and has a magnitude varying in accordance with the temperature of said device, wherein the reference limit signal is varied so as to allow a higher maximum power dissipation by said device at lower device temperatures than at higher device temperatures before the control means modifies operation of said device.

2. A semiconductor device protection circuit according to claim 1 which includes additional control means coupled to said device for reducing current through said device in response to the magnitude of a current sense signal, indicative of the current in said semiconductor device when said device is on, exceeding the magnitude of a second predetermined reference limit signal, whereby said additional control means implements a short circuit protection function for said device while said first control means implements a power dissipation limit function for said device.

3. A semiconductor device protection circuit according to claim 2 wherein said power dissipation sense signal comprises a current sense signal having a magnitude indicative of the current passed through said device when said device is on.

4. A semiconductor device protection circuit according to claim 3 wherein said magnitude of said current sense signal is a function of the temperature of said semiconductor device.

5. A semiconductor device protection circuit according to claim 3 wherein said reference limit signal varies by at least 0.10 percent per degree centigrade of the temperature of said device.

6. A semiconductor device protection circuit according to claim 5 wherein said reference limit signal magnitude varies inversely as a function of the temperature of said semiconductor device.

7. A semiconductor device protection circuit according to claim 6 wherein said developing means includes at least one temperature sensing semiconductor device mounted adjacent to said semiconductor device receiving said control signal, said temperature sensing semiconductor device providing said sensed temperature signal.

8. A semiconductor device protection circuit according to claim 7 wherein said temperature sensing semiconductor device comprises at least one diode mounted on a semiconductor die which is separate from a semiconductor die which comprises the semiconductor device controlled by said first control means, both of said dies being mounted to a common heat sink.

9. A semiconductor device protection circuit according to claim 8 wherein said semiconductor device is a FET transistor.

10. A semiconductor device protection circuit according to claim 9 wherein said current sense signal is the voltage across drain and source electrodes of said FET multiplied by a predetermined gain factor.

11. A semiconductor device protection circuit according to claim 10 which includes delay means for delaying operation of said first control means for a first predetermined delay time after each turning on of said semiconductor device.

12. A semiconductor device protection circuit comprising:

semiconductor device for receiving at least one control signal and, in response thereto, selectively passing current therethrough;

sense means coupled to said device for developing a current sense signal having a magnitude indicative of the current passed through said device when said device is on;

first control means for receiving said current sense signal and a first predetermined reference limit signal and modifying said control signal to reduce current through said device in response to the magnitude of said sense signal exceeding the magnitude of said reference limit signal by a predetermined amount; and means for developing said predetermined referenced limit signal such that said reference limit signal varies in accordance with a sensed temperature signal and has a magnitude varying in accordance with the temperature of said device, wherein the reference limit signal is varied so as to allow a higher maximum current through said device at lower device temperatures than at higher device temperatures before the control means modifies operation of said device.

13. A semiconductor device protection circuit according to claim 12 which includes additional control means coupled to said device for reducing current through said device in response to the magnitude of said current sense signal exceeding the magnitude of a second predetermined reference limit signal, said second reference signal magnitude being greater than said first reference signal magnitude, whereby said additional control means implements a short circuit protection function for said device while said first control means implements a power dissipation limit function for said device.

14. A semiconductor device protection circuit according to claim 12 wherein said control means includes means for turning said semiconductor device off at a first predetermined time after and in response to the occurrence of said current sense signal exceeding a limit reference signal and which includes means for turning said semiconductor device off at a second predetermined time after and in response to the occurrence of a transition is a signal which determines said control signal, said second time exceeding said first time, whereby turning said semiconductor device off for a sensed overcurrent condition occurs faster than the normal time for turning said semiconductor device off.

* * * * *